(12) United States Patent
Kimes et al.

(10) Patent No.: US 8,624,601 B2
(45) Date of Patent: Jan. 7, 2014

(54) SYSTEM AND METHOD FOR DETERMINING PHYSICAL STATUS OF SWITCH ELEMENTS

(75) Inventors: Justin Kimes, Indianapolis, IN (US);
David Albean, Indianapolis, IN (US);
Ronald Jaeger, Indianapolis, IN (US);
Charlie Capps, Carmel, IN (US);
Timothy Scalzo, Westfield, IN (US);
David Heady, Mooresville, IN (US)

(73) Assignee: Enerdel, Inc., Greenfield, IN (US)

( * ) Notice: Subject to any disclaimer, the term of this patent is extended or adjusted under 35 U.S.C. 154(b) by 521 days.

(21) Appl. No.: 12/897,455

(22) Filed: Oct. 4, 2010

(65) Prior Publication Data
US 2012/0081124 A1 Apr. 5, 2012

(51) Int. Cl.
*G01R 31/02* (2006.01)
*G01R 31/327* (2006.01)

(52) U.S. Cl.
USPC ............ 324/422; 324/415; 324/418; 324/538; 340/644; 340/687; 361/91.4; 361/93.5; 361/115

(58) Field of Classification Search
USPC ......... 324/415, 416, 424, 418, 422, 538, 133; 361/18, 21, 86, 59, 60, 72, 87, 78, 361/91.2, 91.4, 93.1, 93.5, 93.7, 115; 340/644, 687
See application file for complete search history.

(56) References Cited

U.S. PATENT DOCUMENTS

| | | |
|---|---|---|
| 3,559,051 A | 1/1971 | Mazurek |
| 3,746,880 A | 7/1973 | Iritani et al. |
| 4,677,308 A | 6/1987 | Wroblewski et al. |
| 4,853,685 A | 8/1989 | Vogt |
| 4,864,285 A | 9/1989 | Rodden |
| 5,096,147 A | 3/1992 | Brohm et al. |
| 5,136,280 A * | 8/1992 | Heggli ............ 340/644 |
| 5,277,244 A | 1/1994 | Mehta |
| 5,436,788 A | 7/1995 | Wallaert |
| 5,506,573 A | 4/1996 | Ewing et al. |
| 5,585,678 A | 12/1996 | Dijk et al. |
| 5,619,110 A * | 4/1997 | Sugimoto et al. ........... 318/450 |
| 6,507,283 B1 * | 1/2003 | Calvin ............ 340/644 |
| 6,590,752 B1 * | 7/2003 | Schaper et al. .......... 361/23 |
| 2004/0183522 A1 | 9/2004 | Gunn et al. |
| 2004/0240235 A1 * | 12/2004 | Min ................ 363/23 |
| 2007/0024288 A1 * | 2/2007 | Hu ............... 324/547 |

OTHER PUBLICATIONS

International Search Report and Written Opinion in PCT/US2011/053957, Apr. 24, 2012, 9 pgs.

* cited by examiner

*Primary Examiner* — Patrick Assouad
*Assistant Examiner* — Alexander J Nemtzow
(74) *Attorney, Agent, or Firm* — Faegre Baker Daniels LLP

(57) ABSTRACT

System and methods are provided for monitoring a state of a switch element connecting a DC power supply to a load. A system includes a transformer having first and second windings, where a first end of the second winding electrically coupled to a first switch node of the switch element. The system also includes a transmit circuit configured for providing a waveform at the first winding and a sensor element having galvanically isolated input and output nodes for inducing a monitor signal at the output nodes in response to a signal at the input nodes. The system further includes a receive circuit coupled to the output nodes and configured for generating one or more output signals in response to the monitor signal. The system also includes capacitor elements for providing DC isolation for the second winding with respect to the first switch node and the sensor element.

20 Claims, 2 Drawing Sheets

100

200

SYSTEM AND METHOD FOR DETERMINING PHYSICAL STATUS OF SWITCH ELEMENTS

FIELD

The subject matter herein generally relates to switch elements in electric systems and in particularly to systems and methods for determining a physical status of a switch element in an electric system.

BACKGROUND

Electric vehicles and hybrid electric vehicles require onboard batteries to power their electric drive systems. The performance requirements of such vehicles generally require combining a large number of batteries together to provide a sufficiently high voltage and current for powering the electric drive system. For example, Li-ion batteries can be stacked to produce battery packs or modules with very high voltage and current capabilities. In conventional electric or hybrid electric vehicles, such Li-ion batteries often are configured to generate voltages on the order of 400V DC.

Typically, in such vehicle applications, the battery voltage is applied to the drive system under control of a battery management system (BMS) electronic controller. Specifically, the battery is connected to the vehicle via a contactor or other type of switch element controlled by the BMS. Throughout the lifetime of the vehicle, it is possible that the contactors may fail or degrade, resulting in improper operation. Such contactor faults or failures can arise from the very large operating currents and transients that are typically conducted by the contactors during operation of the vehicle. For example, currents in electric vehicles can exceed 200 A under some conditions. As a result, the switch elements used to connect the battery to the vehicle may become stuck open or closed under mechanical and/or electrical stress during operation.

When such contactor failures occur, it is generally desirable to generate control signals for the BMS such that the battery can be disabled to prevent further damage to the vehicle or to reduce the risk of injury to the driver or passengers of the vehicle. Further, it is generally desirable to generate signals such that service personnel can easily assess and repair the contactor failure.

Conventional methods for detecting the physical state of a contactor, a relay, or other types of switch elements in high voltage DC systems typically rely on providing a control loop based on coupling a waveform on a first side of a switch element and thereafter detecting the waveform on the second side of the switch element. For such applications, optocouplers have historically been used for several reasons. In particular, optocouplers have historically provided favorable droop, backswing, and common mode characteristics as compared to other coupling methods. Additionally, configuration of conventional optocoupler devices is well-understood. Further, optocoupler circuits have historically been less expensive and smaller than other types of signal coupling devices.

However, optocouplers have several disadvantages. First, the use of multiple optocouplers to couple and detect waveforms in a circuit generally requires fairly complex supporting circuitry. In particular, such circuits generally require additional power rails and circuit paths for operating multiple optocouplers. This not only increases overall circuit complexity, but also increases the chances of interference between components in the circuit and power requirements for monitoring the contactor. Second, the characteristics of optocouplers can vary during the operation and lifetime of the optocoupler. That is, as a function of time and/or temperature, optocoupler can exhibit variations in current transfer ratios and propagation delays, non-linear transfer characteristics, and other characteristics. Further, the light-emitting diodes (LEDs) in the optocouplers can degrade and wear out over time. Accordingly, the reliability and lifetime of optocouplers is typically limited. However, despite the limitations of optocouplers described above, optocouplers still remain the preferred means of coupling waveforms into a control loop.

SUMMARY

Embodiments of the invention concern new systems and methods for determining the physical status of switching elements. In a first embodiment of the invention, a system for monitoring a state of a switch element connecting a DC power supply to a load is provided. The system includes a transformer having first and second windings, a first end of the second winding electrically coupled to a first switch node of the switch element. The system also includes a transmit circuit configured for providing a first waveform at the first winding. The system further includes a sensor element having galvanically isolated input nodes and output nodes and configured for inducing a monitor signal at the output nodes in response to a signal at the input nodes, where the input nodes electrically coupling a second end of the second winding and a second switch node of the switch element. Additionally, the system includes a receive circuit coupled to the output nodes of the sensor element and configured for generating one or more output signals in response to the monitor signal. In the system, capacitor elements are provided for DC isolating the second winding with respect to the first switch node and the sensor element.

In a second embodiment of the invention, a battery operated system is provided. The battery-operated system includes at least one battery module, at least one load circuit, a switch element for coupling the battery module to the load circuit, and a short-circuit path coupling the first and second switch nodes of the switch element. In the system, the short-circuit path includes a DC isolated inductive element in series with a sensor system, where the inductive element configured for inductively coupling a time-varying signal into the short-circuit path. Additionally, the sensor system is configured for generating one or more output signals responsive to the state of the switch element and the time-varying signal.

In a third embodiment, a method for monitoring a state of a switch element connecting a DC power supply to a load is provided. The method includes the step of providing a short-circuit path between the first and second switch nodes, where the short-circuit path includes a plurality of capacitor elements for providing DC isolation between one or more portions of the short-circuit path and the DC power supply. The method also includes the steps of inductively coupling a time-varying signal into one of the DC isolated portions of the short-circuit path and generating a monitor signal using a sensor element in response to the inductively coupled signal in the short-circuit path. The method further includes the step of outputting one or more output signals indicating a state of the switch element based on the monitor signal.

BRIEF DESCRIPTION OF THE DRAWINGS

Embodiments of the present application will now be described, by way of example only, with reference to the attached Figures, wherein.

DETAILED DESCRIPTION

Figure 1:
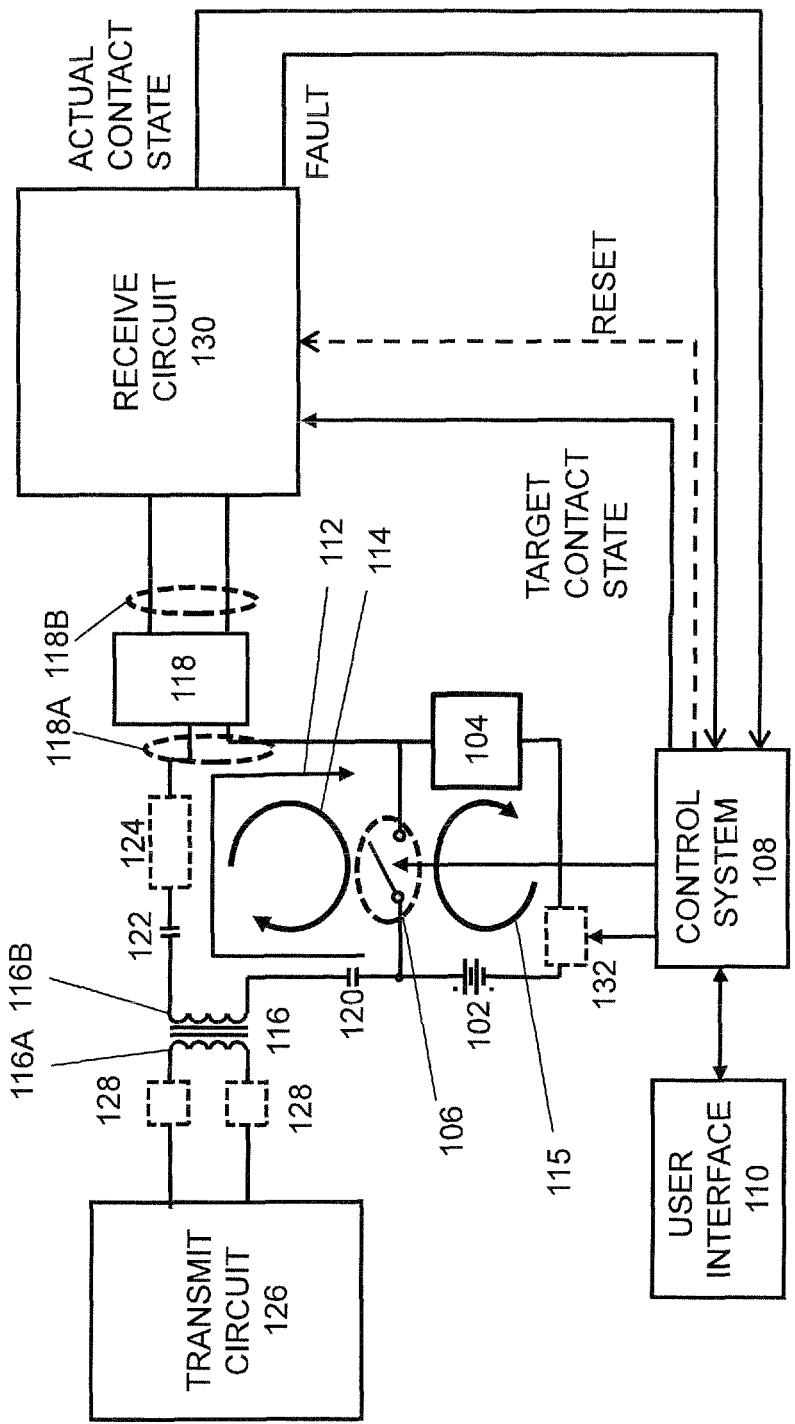
FIG. 1 is a block diagram of an electrical system configured in accordance with an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As described above, the detection of switch element failures in high voltage DC systems is of concern, particularly in the field of electric vehicles. However, in the case of electric vehicles, additional requirements can apply since such vehicles are being used by consumers and will be in service for a relatively long period of time (>3 years). Thus, the systems for detecting contactor failures need to provide high reliability, long operational lifetimes, low power requirements, and insensitivity to environmental conditions. As described above, optocouplers generally have low reliability, short operational lifetimes, high power requirements, and are sensitive to variations in temperature. Accordingly, optocouplers are not the ideal devices for providing time-varying signals in electric vehicles and other electric systems with similar requirements.

In view of the limitations of conventional optocoupler-based monitoring techniques and the additional requirements for electric vehicles, the various embodiments of the invention provide new systems and methods for determining the state of a switch element in DC electric systems. In the various embodiments of the invention, the switch element is monitored by providing a short-circuit path connecting between the first and second nodes of the switch element. This short-circuit can be defined by the second winding of a transformer, where the windings are DC isolated from the DC power supply. Thus, a monitoring loop is defined by the combination of the short-circuit path and the switch element. In operation, a waveform is generated and applied across the first winding of the transformer. In response, a waveform is produced across the second winding. When the contactor is closed (i.e., the electric system is in operation), the waveform can propagate along the monitoring loop. A sensor element in short-circuit path can then be used to detect the presence or absence of the waveform. The output of the sensor element can thereafter be used to generate signals indicating the physical status of the switch element or whether a fault or failure has occurred at the switch element.

The use of a transformer for coupling a waveform into the monitoring loop has several advantages over conventional, pure-optocoupler-based methods. First, a transformer does not require additional power rails, unlike an optocoupler. That is, it is not necessary to provide additional power rails to bias the phototransistors of a conventional optocoupler that will generate the waveform. Rather, the waveform provided at the first winding powers the transformer. Second, a DC isolated transformer is typically simpler to configure and provides substantially greater isolation between blocks in a circuit as compared to optocouplers. Third, a transformer is a simpler device as compared to an optocoupler. Thus, a monitoring circuit using a transformer can be formed using a relatively smaller number of components. Also, recent advances in compact and integrated circuit (IC) based transformers now provide transformers that can be formed in a relatively smaller area and have significantly lower power requirements than circuits using optocouplers. For example, some IC transformer configurations can provide over a 50% reduction in power. Fourth, transformers are generally less prone to degradation, drift, or variation due to time or temperature. Thus, transformers can provide more predictable transfer ratios and functions. Accordingly, transformers can provide substantially greater reliability, predictability, and operational lifetimes as compared to optocouplers.

An additional advantage of utilizing a transformer to couple the waveform into the monitoring loop is that transformers generally have a higher bandwidth than optocouplers and can therefore support higher data transfer rates. Therefore, the waveform coupled into the control loop can not only be used to determine the state of the switch element, but also be used for reliability transmitting large amounts of data to the BMS or other components during operation of the electric system.

Referring now to FIG. 1, there is shown a block diagram of an exemplary DC electric system 100 in accordance with an embodiment of the invention. System 100 includes a DC power supply 102. The supply 102 can consist of one or more DC power sources, such as batteries, AC/DC converters, a chemical fuel cells, solar cells, generators, and alternators, to name a few. However, the various embodiments of the invention are not limited in this regard and any other types or any combination of DC power sources can be used.

As shown in FIG. 1, the power supply 102 is electrically coupled to a load 104 via a switch element 106. As used herein, the term "switch element" refers to any type of device, electrical circuit, or other component configured for selectively disconnecting portions of an electric circuit. In the various embodiments of the invention, the switch element can include devices consisting of mechanical switches, solid-state switches, switching tubes, and/or any other type of switch technologies. In some configurations, the switch element 106 can be controlled directly or indirectly. For example, the switch element 106 can be controlled using a control system 108 for the power supply 102, where the control system operates automatically or in response to user input via a user interface 110. The control system 108 can be the BMS or other devices or systems for controlling the operation in electric system 100.

As described above, the status of the switch element 106 can be monitored via the use of a short-circuit path 112 coupled to the ends or nodes of switch element 106 to form a monitoring loop 114 operating in parallel with the supply loop 115 formed by power supply 102, switch element 106, and load 104. As shown in FIG. 1, the path 112 includes a transformer 116, with a first winding 116A and a second winding 116B, and a sensor element 118, with input nodes 118A and output nodes 118B. In particular, the path 112 is defined by second winding 116B and electrical path between the input nodes 118A. Additionally, the short-circuit path 112 also includes elements for preventing the power supply 102 from discharging electrons into the path 112. Specifically, path 112 includes at least first and second capacitor elements 120 and 122 for providing DC isolation between transformer 116 and power supply 102. Further, no connection or path to ground is provided in path 112, effectively limiting path 112 to signals generated in path 112.

In the various embodiments, the sensor element 118 can be an optocoupler, another transformer, or any other device in which the input nodes 118A are galvanically isolated from the output nodes 118B. Further, path 112 can include other components 124 for monitoring, matching, or any other purposes. For example, in one embodiment, component 124 can include a read resistor. In such a configuration, the control system 108 or other component of system 100 can be configured to monitor the voltage across the read resistor and detect the waveform propagating through monitor loop 114. The data in the waveform can then be extracted and used by system 100 or any other device.

As further shown in FIG. 1, the system 100 can include a transmit circuit 126 for transmitting a waveform across the first winding 116A. In some configurations, the transmit circuit 126 can be directly coupled to the first winding 116A. In other configurations, the transmit circuit 126 can be directly coupled to the first winding 116A via coupling elements 128. For example, the coupling elements 128 can be capacitive elements to provide DC isolation between the transmit circuit 126 and the first winding 116A. In such configurations, the transformer 116, the capacitors 120 and 122 and coupling elements 128 define a DC isolated transformer.

In the various embodiments of the invention, the transmit circuit 126 can be any type of circuit for generating a waveform. For example, the transmit circuit 126 can be formed using RC, LC, or crystal oscillator circuits, monostable, bistable, and astable multi-vibrator circuits, IC-based timer circuits, diode or transistor-based non-linear waveform circuits, rectifier circuits, and digital circuit-based signal generating circuits and devices, to name a few. However the various embodiments are not limited in this regard and any other types of circuits and/or devices for generating a waveform can be used in the various embodiments. Additionally, the transmit circuit 126 can be configured to provide a constant waveform or to transmit data by providing a time-varying waveform.

Also, as shown in FIG. 1, the system 100 can include a receive circuit 130 coupled to the output nodes 118B. The receive circuit 130 can be configured to include logic for generating signals indicative of the current or actual physical state of the switch element 106. Further, the receive circuit 130 can also be configured to include logic for generating a fault signal when the current physical state of the switch element 106 fails to match the target physical state of the switch element 106.

One exemplary process for operating system 100 operates is follows. First, the control system 108 can generate signals or instructions for setting a state of the switch element 106. For example, if load 104 is a drive system for an electric vehicle and operation is desired, the control system 108 can send signals to switch element 106 to cause it to close and thus connect DC power supply 102 to load 104. Alternatively, if operation of the vehicle needs to be paused or terminated, the control system 108 can send signals to switch element 106 to cause it to open and thus disconnect DC power supply 102 from load 104. Concurrently, transmit circuit 126 can generate a waveform propagating through first windings 116A. Responsive to this waveform, the transformer 116 is operable to inductively induce a voltage signal across second windings 116B defining a waveform. Depending on the configuration of transformer 116, the waveforms at windings 116A and 116B can be same or different.

If switch element 106 is open, the waveform at the second winding 116B will not propagate along monitor loop 114. However, when switch element 106 is closed, the waveform at the second winding 116B will propagate along monitor loop 114. A portion of the waveform can also propagate into the power supply loop 115 formed by the DC power supply 102, the switch element 106, and the load 104. However, interference in the operation of load can be avoided by configuring the transmit circuit 126 and/or the transformer 116 to provide a waveform having an amplitude that is substantially less than the voltage of the DC power supply.

Regardless of whether or not a waveform is propagating along monitor loop 114, the sensor element 118 generates a monitor signal at the output nodes 118B based on the signal at the input nodes 118A. In the various embodiments, because the short-circuit path 112 is DC isolated using at least capacitor elements 120, 122 and no path to a ground is available in the path 112, the sensor element 118 is also effectively isolated from the power supply loop 115. Thus, even in the absence of a waveform in path 112, the monitor signal will not be based on the DC signal from the DC power supply 102.

The monitor signal can be generated in a variety of ways at the sensor element 118. For example, in one configuration, the sensor element 118 can be an optocoupler. Thus, depending on the signal present at input nodes 118A, the transistor in the optocoupler can be turned on or off to provide the monitor signal. In another configuration, the sensor element 118 can be a transformer where nodes 118A and 118B define the ends of first and second windings. Thus, a signal is induced at nodes 118B (i.e., the second winding) based on the signal present at nodes 118A (i.e., at the first winding). This induced signal thus provides the monitor signal. In some embodiments, the use of a transformer for the sensor element 118 can provide many, if not all the advantages described above.

Further, if data needs to be transmitted to the receive circuit 130, a transformer for the sensor element 118 may be required if the data rate from the transmit circuit is sufficiently high. That is, although conventional optocouplers can be biased to provide a larger bandwidth to support higher data rates, this is generally at the cost of the current transfer ratio (CTR) of the optocoupler. Accordingly, this can lead to lower efficiency in the optocoupler, lower sensitivity of the phototransistor, and can require a significantly more complex circuit for detecting changes in the phototransistor current. In contrast, the data rate of a transformer is primarily dependent on the resonant frequency of the transformer. Accordingly, the amount of data that can be transmitted is directly tied to the quality and cost of the transformer used, not by the biasing of the transformer. Additionally, provided that a waveform with sufficient energy (i.e., amplitude) is provided, the need for complex circuitry to detect the signal is removed.

Once the monitor signal is generated by sensor element 118 is output at output nodes 118B, the receive circuit 130 can then process the monitor signal. First, the monitor signal can be used to generate a signal representing the actual contact state of the switch element 106. That is, based on the characteristics of the monitor signal, the receive circuit can generate a signal that indicates whether the switch element 106 is actually open or closed. For example, if the monitor signal is a waveform when the switch element 106 is closed, the receive circuit 130 can be configured to include elements for detecting the absence or presence of signal at output nodes 118B. In such configurations, if the sensor element 118 outputs a waveform at output nodes 118B, a small signal transistor can be used to detect the presence of the waveform. Alternatively, a microprocessor, peak detector, or logic gate could also be used. However, the various embodiments of the invention are not limited to these methods. Further, the receive circuit 130 can also communicate a signal indicating the actual contact state to other components in system 100, such as control system 108.

In addition to determining the actual contact state of the switch element 106, the receive circuit can also be configured to generate a fault signal indicating that the actual contact state does not match an intended or target contact state. That is, the receive circuit 130 can include logic or functionality for receiving a signal representing the target contact state. For example, as shown in FIG. 1, the control system 108 or other component of system 100 can provide such a signal.

In operation, the receive circuit 130 can compare the actual contact state and the target contact state. For example, the receive circuit can include logic for comparing the signals representing the actual and target contact states. If the states fail to match, a fault signal can be generated. In some configurations, the receive circuit can be configured to maintain the fault signal until the occurrence of a reset event. That is, the receive circuit 130 can be configured to reset the fault signal when it is powered down. Alternatively, the receive circuit 130 can also be configured to reset the fault signal when an external reset signal is received. In one configuration, such an external signal can be provided by the user via user interface 110 and control system 108 to the receive circuit 130. In another configuration, such an external signal can be automatically generated when a component, such as the switch element 106 is replaced.

In some embodiments, the fault signal can be used to prevent further operation of system 100. For example, the fault signal can be used to operate a secondary or backup switch element 132 to disconnect DC power supply 102 from load 104. Alternatively, the fault circuit can be used to limit the operation of system 100. For example, the fault signal can also be used to activate an auxiliary, short-term DC power supply and disconnect the main power supply. Alternatively, the fault signal can be used to begin a timer in control system 108 or elsewhere and thereafter indicate to the user that at the end of the timer countdown, the system 100 will be deactivated. Such configurations can be useful for ensuring that an electric vehicle or other electric system can be placed in a safe state without increasing risk of harm to the operator.

Figure 2:
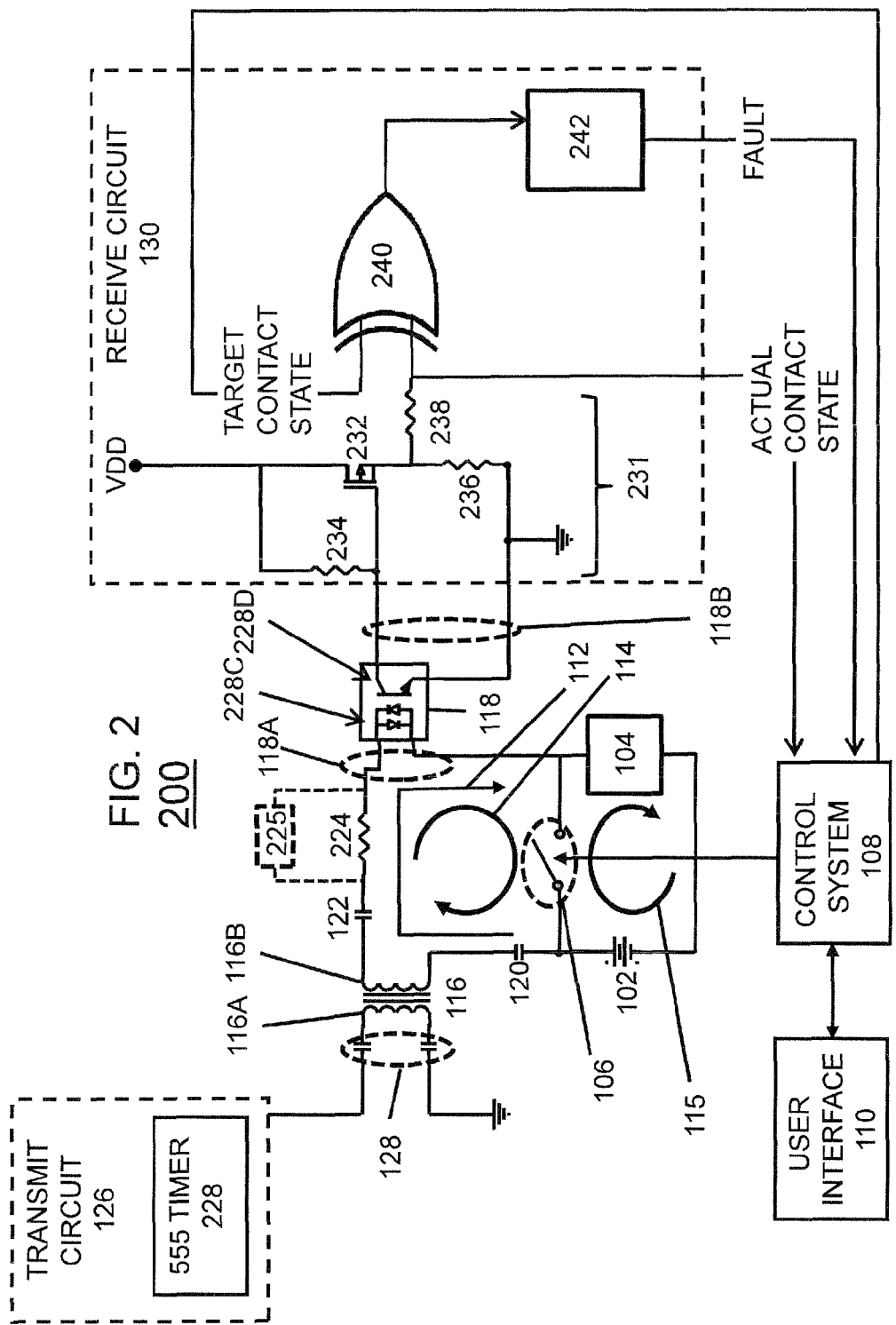
FIG. 2 is a block diagram of an electrical system configured in accordance with a preferred embodiment of the invention.

Referring now to FIG. 2, there is shown a block diagram of an exemplary DC electric system 200 in accordance with a preferred embodiment of the invention. As shown in FIG. 2, system 200 includes components or elements 102-116, 120, and 122, as described above with respect to FIG. 1. Accordingly, the description above with respect to these components and elements in FIG. 1 will be sufficient for describing the configuration and/or operation of these components and elements in FIG. 2.

As shown in FIG. 2, the transmit circuit 126 is implemented using a 555 timer IC 228. In particular, the time IC 228 is configured to operate in an astable multivibrator mode to provide a waveform comprising a continuous stream of rectangular pulses. Accordingly, one of ordinary skill in the art will recognize that the transmit circuit 126 in FIG. 2 would include other components in addition to the timer IC 228. For example, the timer IC 228 in transmit circuit 126 would be configured to be connected to a supply voltage (VDD), a ground or reference voltage, resistors, and capacitors. The types and arrangement of these components with respect to timer IC 228 would be selected to provide a desired waveform. In one embodiment, a 250 kHz rectangular waveform is provided. However, the various embodiments of the invention are not limited in this regard and any other waveform can also be used with an appropriate detection circuit, provided that the waveform has sufficient energy such that transformer energy losses are not significant.

The output of the timer IC 228 can be coupled, directly or indirectly, to a first end of first winding 116A of transformer 116, as shown in FIG. 2. The second end of the first winding 116A can coupled to a ground or reference voltage. As further shown in FIG. 2, the ends of first winding 116A are coupled using coupling elements 128. Specifically, capacitors are used to couple the transmit circuit 126 and a ground voltage to the first and second ends of first winding 116A, respectively.

The system 200 in FIG. 2 also includes a read transistor 224. Such a transistor can be used for matching the input of sensor element 118 to the output of other components in system 200. However, read transistor 224 can also be used to independent monitor the monitor loop 114. Accordingly a sensor 225 can be provided to allow the signal across read transistor 224 to be detected and used for such purposes.

As further shown in FIG. 2, the sensor element 118 is implemented as an optocoupler including one or more LEDs 218C defining the input nodes 118A and an NPN phototransistor 218D defining the output nodes 118B. In the configuration shown in FIG. 2, the sensor element 118 includes two LEDs. Thus, in configurations where the response of the phototransistor 218D is comparable or better than that of the LEDs, the monitor signal comprises waveform with a frequency that is effectively twice that of the waveform at the input nodes 118A. Similar to the configuration in FIG. 1, the output nodes 118A of sensor element 118 are coupled to a receive circuit 118. Alternatively, in configurations where the response of the phototransistor 218D is slower than that of the LEDs, the monitor signal comprises a continuous signal.

In FIG. 2, the receive circuit 130 is configured to generate a signal indicating the actual contact state. Further, the receive circuit 130 is configured to compare the actual contact state signal to a target contact state signal. Thereafter, if the actual and target contact state signals fail to match, a fault signal is generate. Further, the fault signal is maintained until the receive circuit is powered down. One possible configuration for implementing this functionality is illustrated in FIG. 2.

As shown in FIG. 2, the output nodes 118B are coupled to the ground and input nodes of an amplifier circuit 231 formed by transistor 232 and resistors 234, 236, and 238. The configuration and arrangement of these elements can be select to provide an appropriate logic signal to exclusive-OR (XOR) gate 240. Further, the configuration and arrangement of these elements can be select to provide such a logic signal in response to the configuration of the monitor signal. For example, in the case of the monitor signal comprising a waveform, the transistor 232 can be a small-signal transistor. However, the invention is not limited to the configuration shown in FIG. 2 for amplifier 231. Rather, amplifier 231 can be formed using different combinations of elements.

This logic signal generated by amplifier 231 represents the actual (i.e., physical) contact state of the switch element 106. This logic signal can be provided, directly or indirectly, to control system 108. Control system can then generate at UI 110 a display or other indication of the physical state of switch element 106.

To compare the actual contact state signal from the amplifier and the target contact state signal, a comparison of these signals can be performed using the XOR gate 240. The target contact state signal can be provided, directly or indirectly from control system 108. Thus, one of ordinary skill in the art will recognize that receive circuit 130 can include components to provide an appropriate logic signal for the XOR gate 240 based on the target state signal. In operation, as long as the target and actual contact state signal match, the XOR gate 240 provides a first value, indicating a match. However, upon the actual contact state signal varying from the target contact state signal, the output of the XOR gate 240 changes and a second value is provided, indicating a difference and thus a fault.

Although the output of XOR gate 240 indicates when a fault has occurred, in the configuration of FIG. 2, the receive circuit includes components for maintaining a signal indicating a fault until a reset event occurs. Thus, the fault signal is maintained even when the switch element 106 resumes normal operation. For example, as shown in FIG. 2, the receive circuit 120 can include a gated latch circuit 242. In operation, the gated latch circuit 242 is configured to store and output a first signal (indicating no fault) when the XOR gate 240 is providing a first value and to allow changes in the first signal. When the gated latch circuit 242 receives the second value from the XOR gate 240, the gate latch circuit 242 is configured to store and output a second signal (indicating a fault). However, the gated latch circuit 242 is also configured to prevent the any further changes in the stored value, and consequently in its output until power to the gate latch circuit is discontinued. As one of ordinary skill in the art will recognize, several types of gated latch circuits can be used for this purpose.

Portions of system 100 and supporting components can take the form of hardware elements, software elements or elements containing both hardware and software. In one embodiment, the software portions can include, but are not limited to, firmware, resident software, microcode, etc. Furthermore, these software portions can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. Both processors and program code for implementing each as aspect of the system can be centralized or distributed (or a combination thereof) as known to those skilled in the art.

A data processing system suitable for storing program code and for executing program code, which can be implemented in any of the above-referenced devices described herein, can include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. I/O devices (including but not limited to keyboards, displays, pointing devices, etc.) can be coupled to the system either directly or through intervening I/O controllers.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Other configurations are also possible. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A system for monitoring a state of a switch element connecting a DC power supply to a load, comprising:
    a first transformer having first and second windings, a first end of the second winding electrically coupled to a first switch node of the switch element;
    a transmit circuit configured for providing a first waveform at the first winding;
    a sensor element having galvanically isolated input nodes and output nodes and configured for inducing a monitor signal at the output nodes in response to a signal at the input nodes, the input nodes electrically coupling a second end of the second winding and a second switch node of the switch element;
    a receive circuit coupled to the output nodes of the sensor element and configured for generating one or more output signals in response to the monitor signal; and
    a plurality of capacitor elements for providing DC isolation for the second winding with respect to the first switch node and the sensor element.

2. The system of claim 1, further comprising at least one other capacitor element for providing DC isolation for the first winding with respect to the transmit circuit.

3. The system of claim 1, wherein the sensor element comprises an optocoupler.

4. The system of claim 1, wherein the sensor element comprises a second transformer with first and second windings, the first windings of the second transformer defining the input nodes, and the second windings of the second transformer defining the output nodes.

5. The system of claim 1, wherein the output signals comprise a contact state signal indicating a state of the switch element.

6. The system of claim 5, wherein the receive circuit comprises a comparison element configured for generating a fault signal in response to comparing the contact state signal to a target contact state signal, the target contact state signal indicating a target state of the switch element, and the fault signal indicating when the target contact state signal and the contact state signal are different.

7. The system of claim 6, wherein the output signals further comprise a fault signal, and wherein the receive circuit further comprises a gated latch circuit for maintaining the fault signal until a power supply for the receive circuit is disconnected.

8. The system of claim 6, wherein the receive circuit further comprises a gated latch circuit for maintaining the fault signal until a reset signal is received.

9. A battery operated system, comprising:
at least one battery module;
at least one load circuit;
a switch element for coupling the battery module to the load circuit, the switch element having a first switch node and a second switch node;
a path coupling the first and second switch nodes of the switch element, wherein the path comprises a DC isolated inductive element in series with a sensor system, the inductive element configured for inductively coupling a time-varying signal into the path, and the sensor system configured for generating one or more output signals responsive to the state of the switch element and the time-varying signal, wherein the DC isolated inductive element comprises: a DC isolated transformer having first and second windings, a first end of the second winding capacitively coupled to a first switch node of the switch element and a second end of the second winding capacitively coupled to the sensor element; and a transmit circuit configured for providing a time-varying signal at the first winding of the transformer to induce the time varying signal for the path at the second winding.

10. A battery operated system, comprising:
at least one battery module;
at least one load circuit including a load;
a switch element for coupling the battery module to the load circuit, the switch element having a first switch node and a second switch node, the switch element, the at least one battery module, and the at least one load forming a supply loop;
a path coupling the first and second switch nodes of the switch element, wherein the path comprises a DC isolated inductive element in series along the path with a sensor system, the inductive element configured for inductively coupling a time-varying signal into the path, and the sensor system configured for generating one or more output signals responsive to the state of the switch element and the time-varying signal, the path and the switch element forming a monitoring loop, the monitoring loop operating in parallel with the supply loop, the load being part of only one of the monitoring loop and the supply loop.

11. The system of claim 9, wherein the sensor system comprises:
a sensor element having galvanically isolated input nodes and output nodes and configured for generating a monitor signal at the output nodes in response to a signal detected at the input nodes, the input nodes electrically coupling a second end of the second winding and a second switch node of the switch element; and
a receive circuit coupled to the output nodes of the sensor element and configured for generating the output signals in response to at least the monitor signal.

12. The system of claim 11, wherein the sensor element comprises an optocoupler.

13. The system of claim 11, wherein the output signals comprise a contact state signal indicating a state of the switch element.

14. The system of claim 13, wherein the receive circuit comprises a comparison element configured for generating a fault signal in response to comparing the contact state signal to a target contact state signal, the target contact state signal indicating a target state of the switch element, and the fault signal indicating when the target contact state signal and the contact state signal are different.

15. The system of claim 13, wherein the output signals further comprise a fault signal, and wherein the receive circuit further comprises a gated latch circuit for maintaining the fault signal until a power supply for the receive circuit is disconnected or a reset signal is received.

16. A method for monitoring a state of a switch element connecting a DC power supply to a load, comprising:
providing a path between the first and second switch nodes, the path comprising a plurality of capacitor elements for providing DC isolation between one or more portions of the path and the DC power supply;
inductively coupling a time-varying signal into one of the DC isolated portions of the path;
generating a monitor signal using a sensor element in response to the inductively coupled signal in the path;
outputting one or more output signals indicating a state of the switch element based on the monitor signal.

17. The method of claim 16, wherein the step of providing further comprises forming one of the DC isolated portions using a first winding of a first transformer, and wherein the step of coupling further comprises applying a time-varying signal across a second winding of the first transformer to induce the time-varying signal for the path.

18. The method of claim 16, wherein the step of providing further comprises a portion of the path using a first winding of a second transformer, and wherein the step of generating further comprises selecting a signal generated across a second winding of the second transformer as the monitor signal.

19. The method of claim 16, wherein the step of providing further comprises a portion of the path using input nodes of an optocoupler, and wherein the step of generating further comprises selecting a signal generated across output nodes of the optocoupler as the monitor signal.

20. The method of claim 16, wherein the step of outputting further comprises:
generating a contact state signal indicating a state of the switch element;
comparing the contact state signal to a target contact state signal, the target contact state signal indicating a target state of the switch element;

generating a fault signal to indicate a fault state when the contact state signal and target contact state signal are different; and maintaining the fault signal until occurrence of a reset event.

* * * * *